United States Patent
Nakano

(10) Patent No.: US 6,181,176 B1
(45) Date of Patent: Jan. 30, 2001

(54) OUTPUT BUFFER CIRCUIT

(75) Inventor: Toshihiko Nakano, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/272,348

(22) Filed: Mar. 19, 1999

(30) Foreign Application Priority Data

Mar. 20, 1998 (JP) .................................. 10-072333

(51) Int. Cl.$^7$ ............................................. H03K 19/0185
(52) U.S. Cl. ................................. 327/170; 326/26; 326/27
(58) Field of Search ............................ 327/170, 379, 327/389, 390, 391; 326/17, 26, 27, 29, 30, 82, 83, 86, 87

(56) References Cited

U.S. PATENT DOCUMENTS 5,670,894 * 9/1997 Takaishi et al. ...................... 326/27
5,825,219 * 10/1998 Tsai ...................................... 327/112

FOREIGN PATENT DOCUMENTS

| 2-92112 | * | 3/1990 | (JP) | ..................... | 326/27 |
| 4-263514 | * | 3/1990 | (JP) | ..................... | 326/27 |
| 3-151716 | * | 6/1991 | (JP) | ..................... | 326/27 |
| 4-94213 | * | 3/1992 | (JP) | ..................... | 326/27 |
| 8-63267 | | 3/1996 | (JP) | . | |

* cited by examiner

*Primary Examiner*—Tuan T. Lam
(74) *Attorney, Agent, or Firm*—Sughrue, Mion, Zinn, Macpeak & Seas, PLLC

(57) ABSTRACT

An output buffer circuit of the present invention includes a first circuit which inputs an input signal and produces a first signal by adjusting the slew rate of the input signal and a second circuit which inputs the first signal and produces a second signal by increasing the slew rate of the first signal until a predetermined time period elapses from when the state of the first signal changes. The output buffer circuit has a transistor which includes a control terminal which inputs the second signal and a terminal connected to a transfer path.

12 Claims, 5 Drawing Sheets

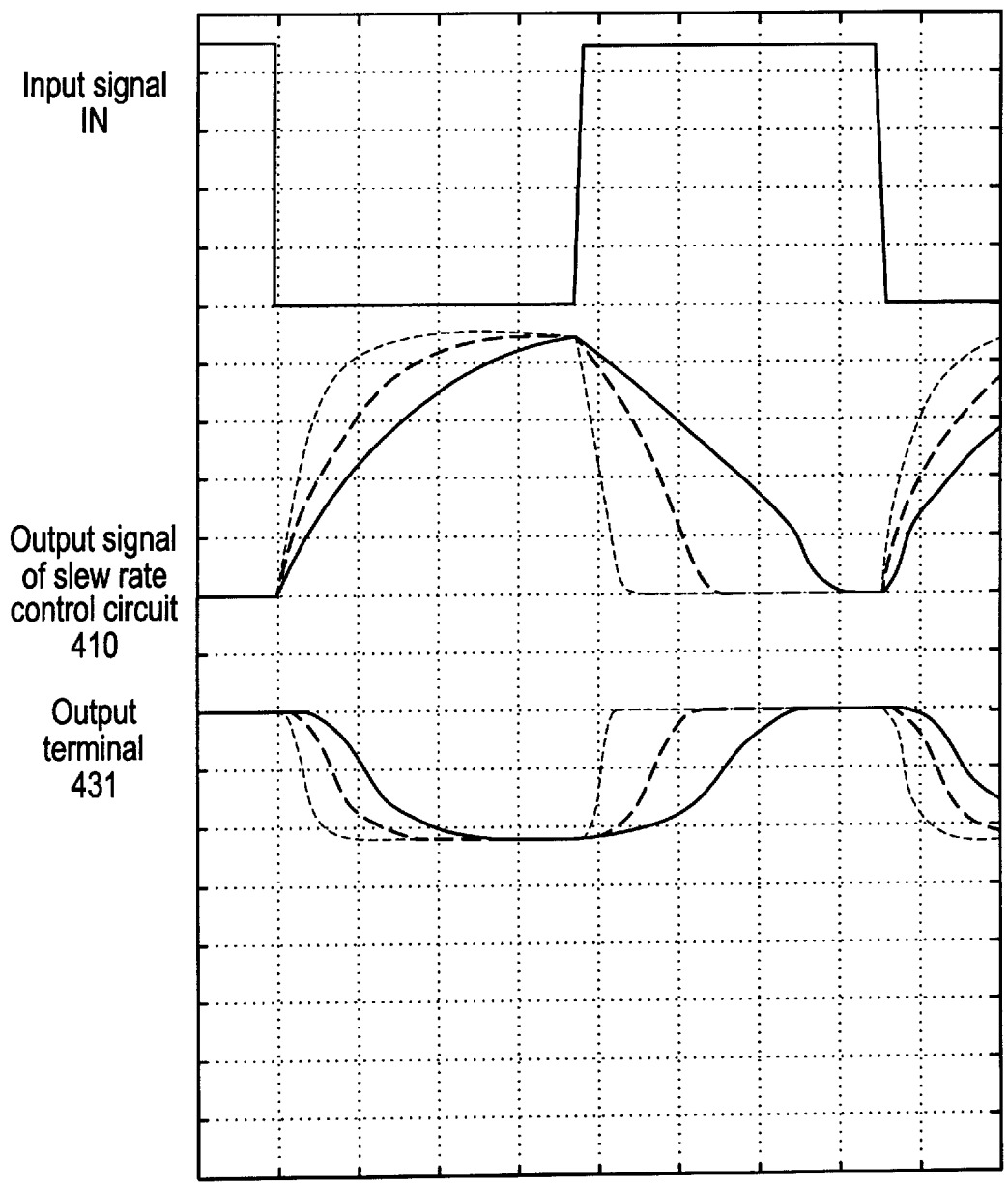

OUTPUT BUFFER CIRCUIT

BACKGROUND OF THE INVENTION

The present invention relates to an output buffer circuit, more particularly, to an output buffer circuit which outputs an output signal whose slew rate has changed.

A conventional output buffer circuit of this kind, which outputs an output signal whose slew rate has changed, is connected to a bus and transmits the output signal. Such a conventional output buffer circuit is, for example, an open drain type and is used in a high-speed bus such as Gunning Transceiver Logic (GTL) or the like. The change of the slew rate is performed to prevent the influence of reflection via the bus.

Referring to FIG. 4, a conventional output buffer circuit has: a negative channel metal-oxide semiconductor (NMOS) transistor 430 in which a drain terminal 4302 is connected to a transfer path 440; and a slew rate control circuit 410 connected to a gate terminal 4301 of NMOS transistor 430. Slew rate control circuit 410 inputs an input signal IN and outputs a signal after adjusting the slew rate of rise or fall of signal IN. An output signal from slew rate control circuit 410 is inputted to gate terminal 4301 of NMOS transistor 430.

FIG. 5 shows the adjusted rise and fall slew rate of the output signal outputted from slew rate control circuit 410. The slew rate of an output signal from NMOS transistor 430, which is outputted to an output terminal 431, can also be changed. In FIG. 5, the slew rate is adjusted to decrease in order from the dotted line, to the dashed line and to the solid line.

An example of such a conventional output buffer circuit is disclosed in Japanese Unexamined Patent Publication No. Hei 8-63267.

The above-described conventional output buffer circuit creates a problem when the output signal from NMOS transistor 430 falls because the operation start time of NMOS transistor 430 differs when the slew rate is fast and when the slew rate is slow (hereinafter, the time difference is referred to as offset time). NMOS transistor 430 is off during a time period in which a voltage value of the output signal from slew rate control circuit 410 stays in a range from 0 V through threshold value voltage Vt and turns on only after the voltage value exceeds the threshold value voltage Vt. Therefore, when the inclination of the output signal from slew rate control circuit 410 becomes small, it takes time until the voltage value exceeds the threshold value voltage Vt.

Furthermore, the above-described conventional output buffer circuit creates another problem when the output signal from NMOS transistor 430 rises, although the offset time problem mentioned above does not occur, because the time period until the output signal rises is delayed when the slew rate of the output signal from NMOS transistor 430 is adjusted to be small. This is because an output level of slew rate control circuit 410 is excessively high. Generally, the amplitude of the output signal of the transistor of the output buffer is lower than the voltage at the inside of large-scale integration (LSI) which perform at high speed and reduce noise. For example, in a logic such as GTL or the like, while the voltage at inside of LSI is about 3.3 V, 2.5 V or 1.8 V, the amplitude of the output signal from the NMOS transistor is about 0.3 through 0.4 V on the low level side and about 1.2 through 1.5 V on the high level side. That is, a signal which has a higher potential level than potential of a drain terminal, which is an output terminal, is applied on the gate electrode of the transistor. When the voltage of the drain terminal is at a low level, since drain-source voltage Vds of NMOS transistor 430 is small, the drain current of NMOS transistor 430 does not flow immediately, even if a chance in a signal inputted to gate terminal 4301 transits from a high level to a low level. After some time elapses, because the potential of a signal inputted to gate terminal 4301 has started to fall, the drain current of NMOS transistor 430 starts to flow based on the gate voltage, and the level of output terminal 431 rises. Therefore, when the slew rate is slow, the falling of the potential of a signal inputted to the gate terminal is delayed and accordingly, the rise of the output terminal 431 is delayed.

SUMMARY OF THE INVENTION

An object of the present invention is to provide an output buffer circuit in which the start of operation of an output transistor does not change when slew rates are large or small.

Another object of the present invention is to provide an output buffer circuit in which start of change of an output signal does not change when slew rate are large or small. More specifically, there is provided an output buffer circuit in which the start of change of the output signal is not delayed when the slew rate is small.

According to one aspect of the present invention, an output buffer circuit is provide which includes: a first circuit which inputs an input signal and produces a first signal by adjusting the slew rate of the input signal; a second circuit which inputs the first signal and produces a second signal by increasing the slew rate of the first signal until a predetermined time period passes from when the state of the first signal changes; and a transistor which includes a control terminal which inputs the second signal and a terminal connected to a transfer path.

According to another aspect of the present invention, an output buffer circuit is provided which includes: a first circuit which inputs an input signal and produces a first signal by adjusting the slew rate of the input signal; a first transistor which includes a control terminal which inputs the input signal, a first terminal connected to a first power supply terminal and a second terminal; a first delay element which includes an input terminal which inputs the input signal and an output terminal which delays the input signal and outputs a first delayed signal; a second transistor which includes a control terminal which inputs the first delayed signal, a first terminal connected to the second terminal of the first transistor and a second terminal connected to an output terminal of the first circuit; a third transistor which includes a control terminal which inputs the input signal, a first terminal connected to a second power supply terminal and a second terminal; a second delay element which includes an input terminal which inputs the input signal and an output terminal which delays the input signal and outputs a second delayed signal; a fourth transistor which includes a control terminal which inputs the second delayed signal, a first terminal connected to the second terminal of the third transistor and a second terminal connected to the output terminal of the first circuit; and an output transistor which includes a control terminal which is connected to the output terminal of the first circuit and a terminal connected to a transfer path.

According to another aspect of the present invention, an output buffer circuit is provided which includes: a first circuit which inputs an input signal and produces a first signal by adjusting a slew rate of the input signal; a first transistor which includes a control terminal which inputs the input signal, a first terminal connected to a first power supply terminal and a second terminal; a first comparing element which compares an output from the slew rate adjusting circuit with a first potential; a second transistor which includes a control terminal which inputs an output from the first comparing element, a first terminal connected to the second terminal of the first transistor and a second terminal connected to an output terminal of the first circuit; a third transistor which includes a control terminal which inputs the input signal, a first terminal connected to a second power supply terminal and a second terminal; a second comparing element which compares the output from the first circuit (a potential of the first signal) with a second potential; a fourth transistor which includes a control terminal which inputs an output from the second comparing element, a first terminal connected to the second terminal of the third transistor and a second terminal connected to the output terminal of the first circuit; and an output transistor which includes a control terminal which is connected to the output terminal of the first circuit and a terminal connected to a transfer path.

BRIEF DESCRIPTION OF THE DRAWINGS

Other features and advantages of the invention will be made more apparent by the following detailed description and the accompanying drawings, wherein:

FIG. 5 is a waveform diagram of the conventional output buffer circuit.

In the drawings, the same reference numerals represent the same structural elements.

DETAILED DESCRIPTION OF THE PREFERRED EMBODIMENTS

A first embodiment of the present invention will be described in detail below.

Figure 1:
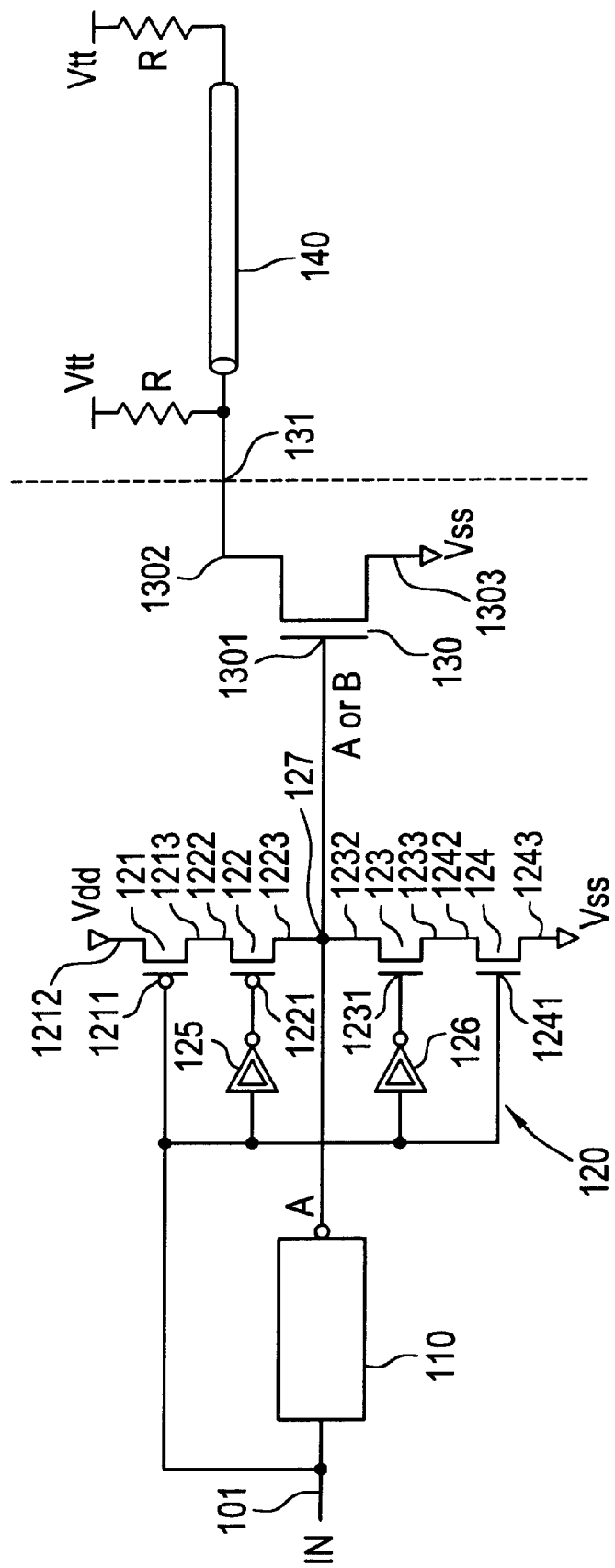
FIG. 1 is a circuit diagram of a first embodiment of the present invention.

Referring to FIG. 1, a first embodiment of an output buffer circuit of the present invention includes a slew rate control circuit 110, a waveform shaping circuit 120 and an NMOS transistor 130. NMOS transistor 130 is connected to a transfer path 140 in an open drain connection.

Slew rate control circuit 110 has an input terminal and an output terminal. The input terminal of slew rate control circuit 110 inputs an input signal IN to be outputted to the transfer path. Slew rate control circuit 110 reverses input signal IN and produces a signal A by adjusting the slew rate of input signal IN. Slew rate control circuit 110 outputs signal A from the output terminal. The output terminal of slew rate control circuit 110 is connected to waveform shaping circuit 120.

Waveform shaping circuit 120 inputs input signal IN from input terminal 101 and signal A from slew rate control circuit 110, and produces a signal B by increasing the slew rate of signal A and outputs signal B until a predetermined time period passes after the state of signal A has been switched. After the elapse of the predetermined time period, waveform shaping circuit 120 outputs signal A as it is. Thus, waveform shaping circuit 120 outputs signal A or signal B based on the time after the state of signal A, changed. Waveform shaping circuit 120 includes PMOS transistors 121 and 122, NMOS transistors 123 and 124, inverters 125 and 126 and a node 127. Node 127 is connected to the output terminal of slew rate control circuit 110.

PMOS transistor 121 includes a gate terminal 1211, a source terminal 1212 and a drain terminal 1213. Gate terminal 1211 is connected to input terminal 101. The potential of a power source terminal Vdd is from 2.5 to 3.3 V. Preferably, it is set to 2.5 V. Drain terminal 1213 is connected to node 127 via PMOS transistor 122.

PMOS transistor 122 includes a gate terminal 1221, a source terminal 1222 and a drain terminal 1223. Gate terminal 1221 is connected to an output terminal of inverter 125. Source terminal 1222 is connected to drain terminal 1213 of PMOS transistor 121 and is connected to power source terminal Vdd via PMOS transistor 121. Drain terminal 1223 is connected to node 127 and a drain terminal 1232 of NMOS transistor 123.

NMOS transistor 123 includes a gate terminal 1231, a drain terminal 1232 and a source terminal 1233. Gate terminal 1231 is connected to an output terminal of inverter 126. Drain terminal 1232 is connected to node 127 and drain terminal 1223 of PMOS transistor 122. Source terminal 1233 is connected to a drain terminal 1242 of NMOS transistor 124 and connected to a power source terminal Vss via NMOS transistor 124.

NMOS transistor 124 includes a gate terminal 1241, drain terminal 1242 and a source terminal 1243. Gate terminal 1241 is connected with input terminal 101. Drain terminal 1242 is connected to source terminal 1233 of NMOS transistor 123 and is connected to node 127 via NMOS transistor 123. Source terminal 1243 is connected to power source terminal Vss. In this embodiment, the potential of power source terminal Vss is the ground.

Inverter 125 has an input terminal and an output terminal. The input terminal of inverter 125 is connected to input terminal 101 and the output terminal of inverter 125 is connected to gate terminal 1221 of PMOS transistor 122. Inverter 125 has a delay time. Inverter 125 delays input signal IN inputted to input terminal 101, reverses its logic and outputs it.

Inverter 126 has an input terminal and an output terminal. The input terminal of inverter 126 is connected to input terminal 101 and the output terminal of inverter 126 is connected to gate terminal 1231 of NMOS transistor 123. Inverter 126 has a delay time. Inverter 126 delays input signal IN inputted to input terminal 101, reverses its logic and outputs it.

NMOS transistor 130 includes a gate terminal 1301, a drain terminal 1302 and a source terminal 1303. Gate terminal 1301 is connected to node 127 and inputs an output signal from waveform shaping circuit 120. Drain terminal 1302 is connected to transfer path 140 via an output terminal 131. Source terminal 1303 is connected to ground potential Vss.

Transfer path 140 is connected to a terminal potential Vtt via resistors R. In this embodiment, the terminal potential Vtt is 1.5 V.

Next, the operation of this embodiment will be described.

Figure 2:
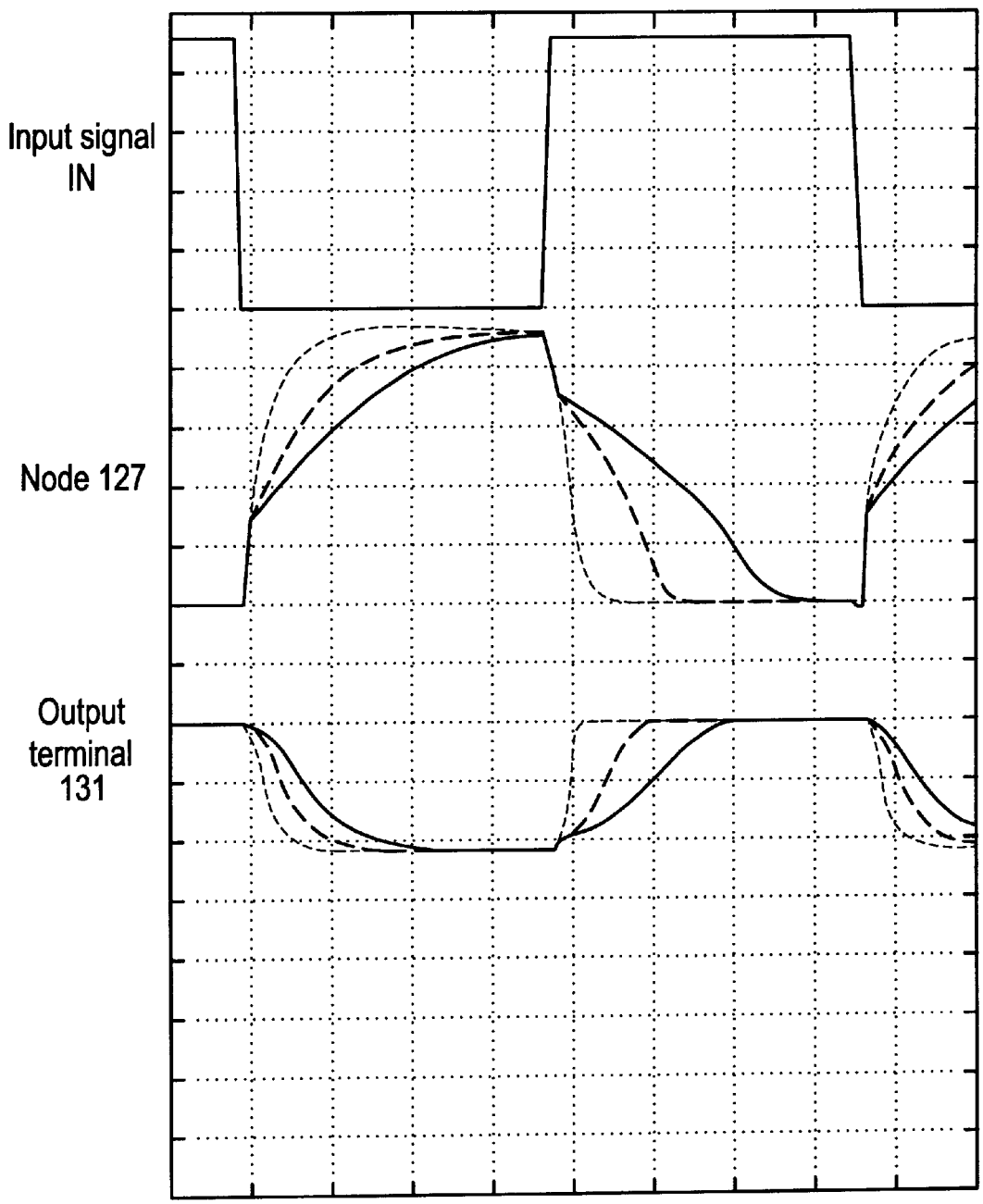
FIG. 2 is a waveform diagram of the first embodiment of the present invention.

Referring to FIGS. 1 and 2, when input signal IN is stabilized at a high level, slew rate control circuit 110 reverses input signal IN and outputs a signal at a low level to node 127. Inverter 125 outputs signal A which is a low level. An output at a low level from the inverter 122 is inputted to gate terminal 1221 of PMOS transistor 125 and accordingly, PMOS transistor 122 is on. Input signal IN at the high level is inputted to gate terminal 1211 of PMOS transistor 121 and accordingly, PMOS transistor 121 is turned off. Therefore, node 127 is separated from power source terminal Vdd.

Input signal IN at the high level is inputted to gate terminal 1241 of NMOS transistor 124 and accordingly, NMOS transistor 124 is on. Inverter 126 outputs a signal at a low level and accordingly, the signal at the low level is inputted to the gate terminal of NMOS transistor 123. Therefore, NMOS transistor 123 is off and node 127 is separated from power source terminal Vss.

Therefore, when input signal IN stays statically at the high level, node 127 is separated from both of input terminals Vdd and Vss and accordingly, signal A, the output from slew rate control circuit 110, is outputted to node 127.

Next, the operation until the delay time of inverter 125 elapses after input signal IN transits from a high level to a low level, will be described below.

Slew rate control circuit 110 reverses input signal IN, adjusts the slew rate and outputs it. That is, a signal provided at node 127 transitions from a low level to a high level.

PMOS transistor 121 transitions from off to on the based on transition of input signal IN from a high level to a low level. Inverter 125 continues outputting the signal at the low level until a predetermined time period elapses, even when input signal IN transitions from a high level to a low level, Specifically, the predetermined time period is a delay time of inverter 125. Therefore, the signal at the low level is inputted to gate terminal 1221 of PMOS transistor 122 until elapse of the predetermined time period and PMOS transistor 122 is maintained to be on. Since PMOS transistors 121 and 122 are on simultaneously during the predetermined time period after input signal IN has transitioned from a high level to a low level, a current path is formed between node 127 and power source terminal Vdd and node 127 is connected to power source terminal Vdd. At node 127, current is drawn to the side of power source terminal Vdd and accordingly, the potential of node 127 rises and the slew rate of a rise signal outputted to node 127 is increased.

In the meantime, when the input signal transitions from a high level to a low level, after the elapse of the delay time of inverter 126, the output from inverter 126 transitions from a low level to a high level. However, based on transition of input signal IN from a high level to a low level, NMOS transistor 124 transitions from on to off. Therefore, node 127 is separated from power source terminal Vss.

In this way, until the elapse of the delay time of inverter 125 after input signal IN has transitioned from a high level to a low level, waveform shaping circuit 120 increases the slew rate of a signal outputted from slew rate control circuit 110 and outputs it.

Next, the operation until the delay time of inverter 125 has elapsed after the transition of input signal IN from a high level to a low level, will be described below.

The output signal of inverter 125 transitions from a low level to a high level after the elapse of the predetermined time period after the transition of input signal IN from a high level to a low level. PMOS transistor 122 turns off when the output signal from inverter 125 transitions from a low level to a high level. PMOS transistor 121 stays off and accordingly, both PMOS transistors 121 and 122 are off. Therefore, no current path is formed between node 127 and power source terminal Vdd and node 127 is separated from power source terminal Vdd.

On the other hand, because NMOS transistor 124 is off, no current path is formed between node 127 and the power source Vss regardless of the state of NMOS transistor 123. Thus, node 127 is separated from power source terminal Vss.

In this way, when the delay time of inverter 125 has elapsed after the transition of input signal IN from a high level to a low level, node 127 is separated from both of the power source terminals Vdd and Vss and accordingly, the output from slew rate control circuit 110 is provided as it is at node 127. That is, waveform shaping circuit 120 outputs the output signal from slew rate control circuit 110 as it is. The potential of the signal outputted to node 127 rises to Vdd by adjusting slew rate control circuit 110. The delay time of inverter 125 is preferably set to a delay time whereby the potential of the signal at node 127 rises to a degree exceeding the threshold value voltage Vt of NMOS transistor 130 after the signal at node 127 starts to rise. In this embodiment, the threshold voltage Vt of NMOS transistor 130 ranges from 0.3 to 0.6 V, however, it is 0.5 V.

When input signal IN is stabilized at a low level, slew rate control circuit 110 reverses input signal IN and outputs a signal at a high level to node 127. Gate terminal 1211 of PMOS transistor. 121 inputs input signal IN at a low level and accordingly, PMOS transistor 121 is on. Inverter 125 outputs a signal at a high level. Gate terminal 1221 of PMOS transistor 122 inputs an output at a high level from inverter 125 and accordingly, PMOS transistor 122 is off. Therefore, node 127 is separated from power source terminal Vdd.

Inverter 126 outputs a signal at a high level and accordingly, gate terminal 1231 of NMOS transistor 123 inputs the signal at a high level. Therefore, NMOS transistor 123 is on. Gate terminal 1241 of NMOS transistor 124 inputs input signal IN at a low level and therefore, NMOS transistor 124 is off. Therefore, node 127 is separated from power source terminal Vss.

In this way, when input signal IN stays statically at a low level, node 127 is separated from both of the input terminals Vdd and Vss and accordingly, waveform shaping circuit 120 outputs signal A, the output from slew rate control circuit 110, to node 127.

Next, the operation until the delay time of inverter 126 has elapsed after the transition of input signal IN from a low level to a high level, will be described below.

Slew rate control circuit 110 reverses input signal IN, adjusts the slew rate and outputs it. That is the signal provided at node 127 transitions from a high level to a low level.

When input signal IN transitions from a low level to a high level, the output from inverter 125 transitions from a high level to a low level if the delay time of inverter 125 has elapsed. In this circumstance, PMOS transistor 122 transitions from off to on based on the transition of the output from inverter 125 to a low level. However, based on the transition of input signal IN from a low level to a high level, PMOS transistor 121 transitions from on to off. Therefore, no current path is formed between node 127 and power source terminal Vdd and node 127 is separated from power source terminal Vdd.

NMOS transistor 124 transitions from off to on based on the transition of input signal IN from a low level to a high level. Inverter 126 continues outputting a signal at a high level until the elapse of the predetermined time period, even when input signal IN transitions from a low level to a high level. Specifically, the predetermined time period is the delay time of inverter 126. Therefore, gate terminal 1231 of NMOS transistor 123 inputs the signal at a high level until the elapse of the predetermined time period and PMOS transistor 122 is kept on. Because NMOS transistors 123 and 124 are both simultaneously on, node 127 is connected to power source terminal Vss. At node 127, current is drawn to power source terminal Vss and accordingly, the potential of node 127 falls and the slew rate of a fall signal outputted to node 127 is increased.

In this way, until the elapse of the delay time of inverter 126 after the transition of input signal IN from a low level to a high level, waveform shaping circuit 120 increases the slew rate of a signal outputted from slew rate control circuit 110 and outputs it.

Next, the operation until the delay time of inverter 126 has elapsed since transition of input signal IN from a low level to a high level, will be described below.

PMOS transistor 121 stays off and therefore, no current path is formed between node 127 and power source terminal Vdd regardless of whether PMOS transistor 122 is on. Thus, node 127 is separated from power source terminal Vdd.

On the other hand, input signal IN at a high level is inputted to gate terminal 1241 of NMOS transistor 124, therefore, NMOS transistor 124 is kept on. Inverter 126 makes the output signal transition from a high level to a low level when the predetermined time period has elapsed after the transition of input signal IN from a low level to a high level NMOS transistor 123 turns off when the output signal from inverter 126 transitions from a high level to a low level. Therefore, no current path is formed between node 127 and power source terminal Vss and node 127 is separated from power source terminal Vss.

In this way, when the delay time of inverter 126 has elapsed after the transition of input signal IN from a high level to a low level, node 127 is separated from both power source terminals Vdd and Vss. Therefore, signal A, the output from slew rate control circuit 110, is provided at node 127. That is, waveform shaping circuit 120 outputs the output signal from slew rate control circuit 110 as it is. The potential of the signal outputted at node 127 drops to Vss by adjusting slew rate control circuit 110. It is preferable to design the delay time of inverter 126 to a time when the output from waveform shaping circuit 120 falls to a potential equal to or substantially equal to the high level Vtt of output terminal 131 after the signal of node 127 starts to fall. In this embodiment, the high level Vtt of output terminal 131 is 1.5 V and it is preferable to design the delay time of inverter 126 to such time that the output from waveform shaping circuit 120 falls from a high level (for example, 2.5 V) to approximately 1.5 through 2.0 V. Preferably, it is a time period such that the output falls to 1.8 V.

As described above, in this embodiment, waveform shaping circuit 120 inputs the signal outputted from the slew rate adjusting circuit 110 and outputs it after increasing the slew rate of the signal until the elapse of the predetermined time period after the state of the signal changes. Therefore, there is no difference in the operation start time of NMOS transistor 130 when the slew rate has been adjusted considerably or when it has been adjusted inconsiderably.

Next, a second embodiment of the present invention will be described below.

A feature of the second embodiment resides in the constitution of the waveform shaping circuit. The other portions of the circuit are similar to the circuit in the first embodiment.

Figure 3:
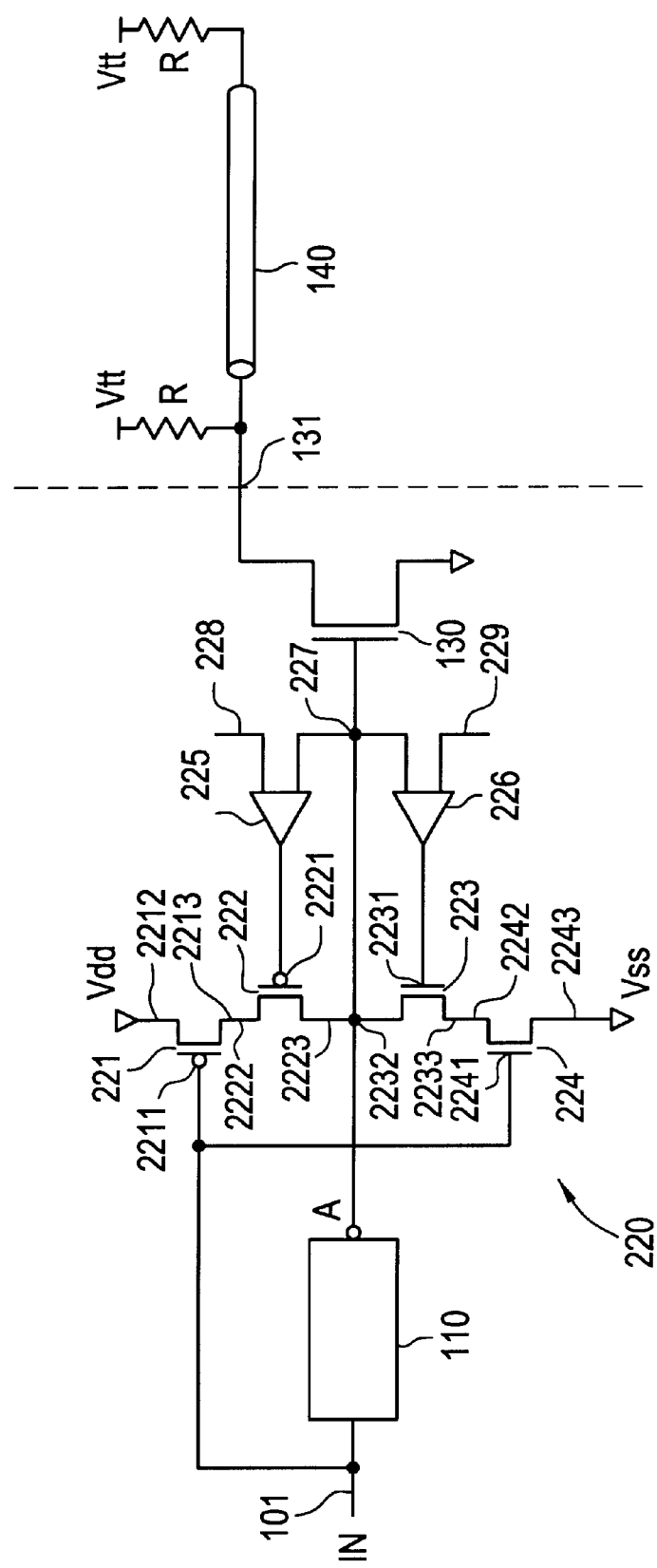
FIG. 3 is a circuit diagram of a second embodiment of the present invention.
Figure 4:
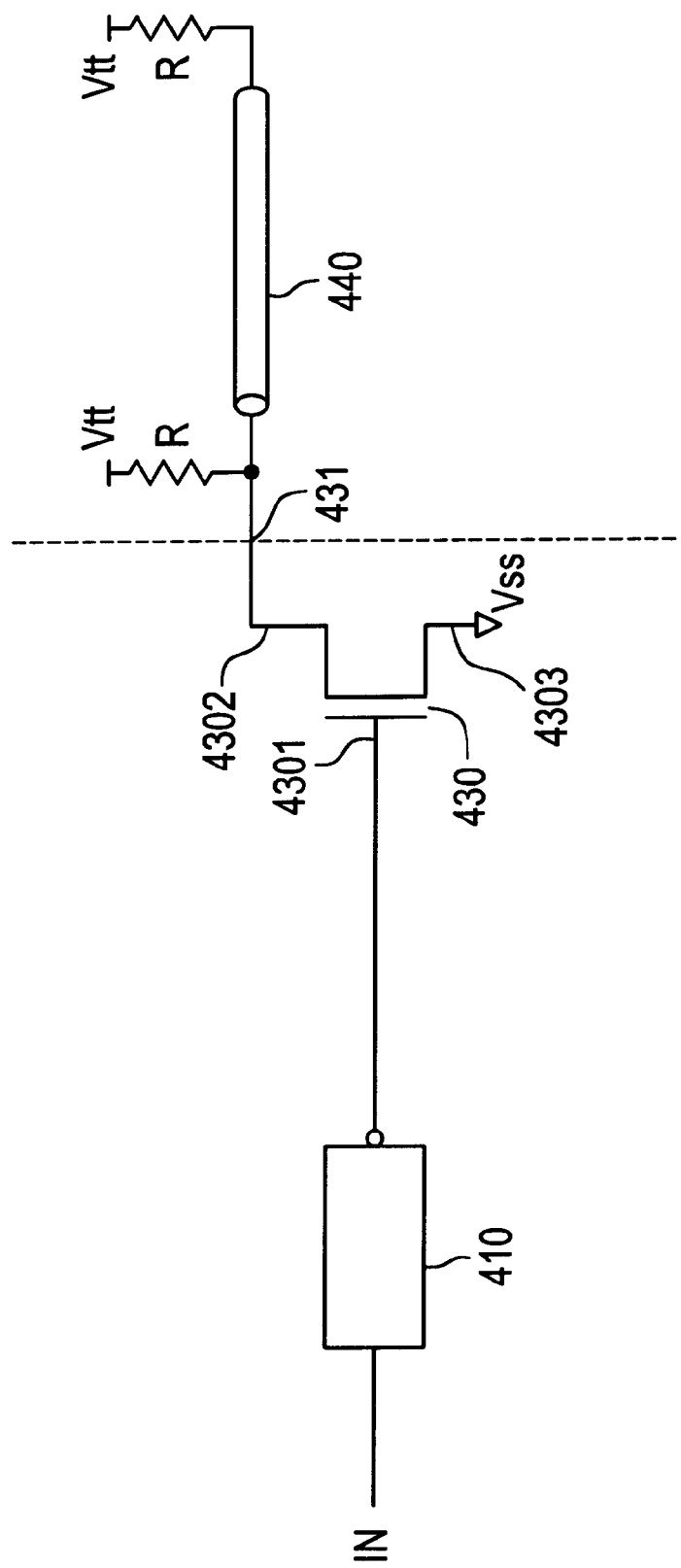
FIG. 4 is a circuit diagram of a conventional output buffer circuit.

Referring to FIG. 3, a waveform shaping circuit 220 includes PMOS transistors 221 and 222, NMOS transistors 223 and 224, differential amplifying circuits 225 and 226 and a node 227. Node 227 is connected to the output terminal of slew rate control circuit 110. PMOS transistors 221 and 222, NMOS transistors 223 and 224 and node 227 have constitutions similar to those of PMOS transistors 121 and 122, NMOS transistors 123 and 124 and node 127, respectively.

Differential amplifying circuit 225 includes a first input terminal, a second input terminal and an output terminal. The first input terminal inputs a control signal 228. Preferably control signal 228 is a signal at a fixed potential that is set to a potential equal to, or substantially equal to, the threshold value potential Vt of NMOS transistor 130. In this embodiment, the potential of control signal 228 ranges from 0.3 to 0.6 V. Preferably, it is 0.5 V. The second input terminal is connected to node 227. The output terminal is connected to a gate terminal 2221 of PMOS transistor 222. Differential amplifying circuit 225 outputs a high level when the potential of a signal at node 227 becomes larger than the potential of control signal 228.

Differential amplifying circuit 226 includes a first input terminal, a second input terminal and an output terminal. The first input terminal inputs a control signal 229. It is preferable that control signal 229 is at a fixed potential and is set to potential equal to, or substantially equal to, a high level of a signal at output terminal 131. In this embodiment, control signal 229 is at 1.5 through 2.0 V. Preferably, it is 1.8 V. The second input terminal is connected to node 227. The output terminal is connected to a gate terminal 2231 of PMOS transistor 223. Differential amplifying circuit 226 outputs a low level when the potential of node 227 becomes smaller than the potential of control signal 229.

Next, the operation of this embodiment will be described.

Referring to FIGS. 2 and 3, when input signal IN is stabilized at a high level, slew rate control circuit 110 reverses input signal IN and outputs signal A which is a low level to node 227. The potential of node 227 is smaller than the potential of control signal 228, therefore, differential amplifying circuit 225 outputs a signal at a low level. Gate terminal 2221 of the transistor 222 inputs the output at a low level from differential amplifying circuit 225, therefore, transistor 222 is on. A gate terminal 2211 of transistor 221 inputs input signal IN at a high level, therefore, transistor 221 is off. Accordingly, node 227 is separated from power source terminal Vdd.

In the meantime, a gate terminal 2241 of transistor 224 inputs input signal IN at a high level, therefore, transistor 224 is on. The potential of node 227 is smaller than the potential of control signal 229, therefore, differential amplifying circuit 226 outputs a signal at a low level. Gate terminal 2231 of transistor 223 inputs the signal at a low level, therefore, transistor 223 is off. Thus, node 127 is separated from power source terminal Vss.

In this way, when input signal IN stays statically at a high level, node 227 is separated from both power source terminals Vdd and Vss, therefore, signal A, the output from slew rate control circuit 110, is outputted to node 227.

Next, the operation until the potential of node 227 reaches a potential equal to, or substantially equal to, the threshold value Vt of NMOS transistor 130 after input signal IN has started to transition from a high level to a low level, will be described below.

Slew rate control circuit 110 reverses input signal IN, adjusts slew rate and outputs it. That is, a signal provided at node 227 transitions from a low level to a high level.

PMOS transistor 221 transitions from off to on based on the transition of input signal IN from a high level to a low level. The potential of node 227 is smaller than the potential of control signal 228, therefore, differential amplifying circuit 225 outputs the signal at a low level. Gate terminal 2221 of PMOS transistor 222 inputs the output at the low level from differential amplifying circuit 225, therefore, transistor 222 stays on. That is, PMOS transistors 221 and 222 are simultaneously turned on, therefore, a current path is formed between node 227 and power source terminal Vdd. Thus, node 227 is connected to power source terminal Vdd. At node 127, current is drawn to the side of power source terminal Vdd, therefore, the potential of node 227 rises and the slew rate of the signal is increased.

In the meantime, NMOS transistor 124 transitions from on to off based on the transition of input signal IN from a high level to a low level. Therefore, node 227 is separated from power source terminal Vss by NMOS transistor 124, regardless of whether NMOS transistor 123 stays on or off.

In this way, until the potential at node 127 reaches at a level equal to, or substantially equal to, the potential Vt of the threshold value of NMOS transistor 130 after input signal IN has started to transitions from a high level to a low level, waveform shaping circuit 220 increases the slew rate of the signal which has been outputted from slew rate control circuit 110 and outputs it.

Further, the operation after the potential of node 227 reaches the level equal to, or substantially equal to, the potential of the threshold value of NMOS transistor 130 after input signal IN has started to transition from a high level to a low level, will be described below.

PMOS transistor 221 is kept on after input signal IN is at a low level. The potential of node 227 becomes larger than the potential of control signal 228, therefore, differential amplifying circuit 225 outputs a signal at a high level. Gate terminal 2221 of PMOS transistor 222 inputs the output at a high level from differential amplifying circuit 225, therefore, PMOS transistor 222 turns off. Since PMOS transistor 222 is off, no current path is formed between node 227 and power source terminal Vdd. Node 227 is separated from power source terminal Vdd.

PMOS transistor 224 stays off, therefore, no current path is formed between node 227 and power source terminal Vss. Node 227 is separated from power source terminal Vss.

In this way, after the potential at node 227 has reached a level equal to, or substantially equal to, the potential Vt of the threshold value of NMOS transistor 130 after start of the transition of input signal IN from a high level to a low level, node 227 is separated from both power source terminals Vdd and Vss. Therefore, the output from slew rate control circuit 110 is provided to node 227. That is, waveform shaping circuit 220 outputs the output signal from slew rate control circuit 110.

Next, the operation when input signal IN stays statically at a low level will be described below.

When input signal IN is stabilized at a low level, slew rate control circuit 110 reverses input signal IN and outputs a signal at a high level to node 227. Gate terminal 2211 of PMOS transistor 221 inputs input signal IN at a low level, therefore, transistor 221 is on. The potential at node 227 is larger than the potential of control signal 228, therefore, differential amplifying circuit 225 outputs a signal at a high level. Gate terminal 2221 of PMOS transistor 222 inputs the output at a high level from differential amplifying circuit 225, therefore, transistor 222 is off. Therefore, node 227 is separated from power source terminal Vdd.

The potential of node 227 is larger than the potential of control signal 229, therefore, differential amplifying circuit 226 outputs a signal at a high level. Gate terminal 2231 of NMOS transistor 223 inputs the signal at a high level, therefore, NMOS transistor 223 is on. Gate terminal 2241 of NMOS transistor 224 inputs input signal IN at a low level, therefore, NMOS transistor 224 is off. Therefore, node 227 is separated from power source terminal Vss.

In this way, when input signal IN stays statically at a low level, node 227 is separated from both power source terminals Vdd and Vss. Therefore, the output from slew rate control circuit 110 is outputted to node 227.

Next, the operation until the potential of node 227 reaches a level equal to, or substantially equal to, the potential of a high level of the signal outputted to output terminal 131 after start of the transition of input signal IN from a low level to a high level, will be described below.

Slew rate control circuit 110 reverses input signal IN, adjusts the slew rate and outputs it. That is, a signal provided at node 227 transitions from a high level to a low level.

PMOS transistor 221 transitions from on to off based on the transition of input signal IN from a low level to a high level. Therefore, no current path is formed between node 227 and power source terminal Vdd regardless of whether PMOS transistor 222 is on or off. Thus, node 227 is separated from power source terminal Vdd.

In the meantime, NMOS transistor 224 transitions from off to on based on the transition of input signal IN from a low level to a high level. The potential of node 227 is larger than the potential of control signal 229, therefore, differential amplifying circuit 226 outputs a signal at a high level. Gate terminal 2231 of NMOS transistor 223 inputs the signal at a high level, therefore, NMOS transistor 223 turns on. Because NMOS transistors 223 and 224 are simultaneously on, a current path is formed between node 227 and power source terminal Vss. Thus, node 227 is connected to power source terminal Vss. In node 227, current is drawn to the side of power source terminal Vss, therefore, the level at node 227 falls. In this manner, the slew rate of a fall signal outputted to node 227 is increased.

In this way, until the potential of node 227 has reached the level equal to, or substantially equal to, the potential of a high level of the signal outputted to output terminal 131 after start of the transition of input signal IN from a low level to a high level, waveform shaping circuit 220 outputs a signal which has been outputted from slew rate control circuit 110, by increasing the slew rate.

Further, the operation after the potential of node 227 has reached the level equal to, or substantially equal to, the potential of a high level of the signal outputted to output terminal 131 after start of the transition of input signal IN from a low level to a high level will be described below.

The signal at the high level continues to be inputted to gate terminal 2211 of PMOS transistor 221. Therefore, PMOS transistor 221 is kept off. No current path is formed between node 227 and power source terminal Vdd and node 227 is separated from power source terminal Vdd.

Input signal IN at a high level continues to be inputted to gate terminal 2241 of NMOS transistor 224, therefore, NMOS transistor 124 is kept on. The potential of node 227 becomes smaller than the potential of control signal 229, therefore, the output from differential amplifying circuit 226 becomes a low level. Gate terminal 2231 of NMOS transistor 223 inputs a signal at a low level, therefore, NMOS transistor 223 turns off. Accordingly, no current path is formed between node 227 and power source terminal Vss and node 227 is separated from power source terminal Vss.

In this way, after the potential of node 227 has reached a level equal to, or substantially equal to, the potential at a high level of the signal outputted to output terminal 131 after start of the transition of the input terminal IN from a high level to a low level, node 127 is separated from both of power source terminals Vdd and Vss. Therefore, output from slew rate control circuit 110 is outputted to node 127. That is, waveform shaping circuit 120 outputs the output signal from slew rate control circuit 110 as it is.

As described above, in this embodiment, differential amplifying circuit 225 outputs high level when the potential of the signal of node 227 becomes larger than the potential of control signal 228 and differential amplifying circuit 226 outputs low level when the potential of node 227 becomes smaller than the potential of control signal 229. Accordingly, by adjusting the control signals 228 and 229, it is easy to change the time period for increasing the slew rate from the start of the rise of the signal outputted from slew rate control circuit 110 or from the start of the fall thereof.

Although according to the embodiment, the NMOS transistor is used as a transistor connected to the transfer path, the present invention is not limited thereto but is applicable to any of a PMOS transistor, an NPN transistor and a PNP transistor.

While this invention has been described in conjunction with the preferred embodiments described above, it will now be possible for those skilled in the art to put this invention into practice in various other manners.

What is claimed is:

1. An output buffer circuit comprising:
   a first circuit which inputs an input signal and produces at an output terminal of said first circuit a first signal by adjusting a slew rate of said input signal;
   a first transistor which includes a control terminal which inputs said input signal, a first terminal connected to a first power supply terminal and a second terminal;
   a first delay element which includes an input terminal which inputs said input signal and an output terminal which delays said input signal and outputs a first delayed signal;
   a second transistor which includes a control terminal which inputs said first delayed signal, a first terminal connected to said second terminal of said first transistor and a second terminal connected to an output terminal of said first circuit;
   a third transistor which includes a control terminal which inputs said input signal, a first terminal connected to a second power supply terminal and a second terminal;
   a second delay element which includes an input terminal which inputs said input signal and an output terminal which delays said input signal and outputs a second delayed signal;
   a fourth transistor which includes a control terminal which inputs said second delayed signal, a first terminal connected to said second terminal of said third transistor and a second terminal connected to the output terminal of said first circuit; and
   an output transistor which includes a control terminal which is connected to said output terminal of said first circuit and a terminal connected to a transfer path.

2. The output buffer circuit as claimed in claim 1,
   wherein said first transistor, said first delay element and said second transistor connects said output terminal of said first circuit to said first power supply terminal for a first predetermined time period.

3. The output buffer circuit as claimed in claim 2, wherein said first predetermined time period is set to a time period until an output on said output terminal of said first circuit exceeds a threshold value of said output transistor.

4. The output buffer circuit as claimed in claim 1,
   wherein said third transistor, said second delay element and said fourth transistor connects said output terminal of said first circuit to said second power supply terminal for a second predetermined time period.

5. The output buffer circuit as claimed in claim 4, wherein said second predetermined time period is set to a time period until a potential of said second signal becomes a potential equal to, or substantially equal to, a maximum value of a potential of a signal which said output transistor outputs to said transfer path.

6. An output buffer circuit comprising:
   a first circuit which inputs an input signal and produces at an output terminal of said first circuit a first signal by adjusting a slew rate of said input signal;
   a first transistor which includes a control terminal which inputs said input signal, a first terminal connected to a first power supply terminal and a second terminal;
   a first comparing element which compares an output from said first circuit with a first potential;
   a second transistor which includes a control terminal which inputs an output from said first comparing element, a first terminal connected to said second terminal of said first transistor and a second terminal connected to said output terminal of said first circuit;
   a third transistor which includes a control terminal which inputs said input signal, a first terminal connected to a second power supply terminal and a second terminal;
   a second comparing element which compares said output from said first circuit with a second potential;
   a fourth transistor which includes a control terminal which inputs an output from said second comparing element, a first terminal connected to said second terminal of said third transistor and a second terminal connected to the output terminal of said first circuit; and
   an output transistor which includes a control terminal which is connected to said output terminal of said first circuit and a terminal connected to a transfer path.

7. The output buffer circuit as claimed in claim 6, wherein said first transistor, said first comparing element and said second transistor connects said output terminal of said supply circuit to said first first power terminal for a first predetermined time period.

8. The output buffer circuit as claimed in claim 7, wherein said first predetermined time period is set to a time period until an output on said output terminal of said first circuit exceeds a threshold value of said output transistor.

9. The output buffer circuit as claimed in claim 6,
   wherein said third transistor, said second comparing element and said fourth transistor connects said output terminal of said first circuit to said second power supply terminal for a second predetermined time period.

10. The output buffer circuit as claimed in claim 9, wherein said second predetermined time period is set to a time period until a potential of said second signal becomes a potential equal to, or substantially equal to, a maximum value of a potential of a signal which said output transistor outputs to said transfer path.

11. The output buffer circuit according to claim 6, wherein said first potential is set to a potential equal to or substantially equal to a threshold value potential of said output transistor.

12. The output buffer circuit according to claim 6, wherein said second potential is set to a potential equal to, or substantially equal to, a high level of an output signal which said output transistor outputs to said transfer path.

* * * * *